(12) United States Patent
Larsson et al.

(10) Patent No.: US 6,256,198 B1
(45) Date of Patent: *Jul. 3, 2001

(54) METHOD AND AN APPARATUS FOR AIR-COOLING

(75) Inventors: Nils-Göran Larsson, Lidingö; Björn Gudmundsson, Sollentuna, both of (SE)

(73) Assignee: Telefonaktiebolaget LM Ericsson

( * ) Notice: Subject to any disclaimer, the term of this patent is extended or adjusted under 35 U.S.C. 154(b) by 0 days.

This patent is subject to a terminal disclaimer.

(21) Appl. No.: 09/236,830

(22) Filed: Jan. 25, 1999

(30) Foreign Application Priority Data

Feb. 3, 1998 (SE) .................................................... 9800306

(51) Int. Cl.$^7$ ........................................................ H05K 7/20
(52) U.S. Cl. .................... 361/695; 62/259.2; 165/908; 361/816; 361/831
(58) Field of Search ................. 98/40.05; 62/259.2; 165/908; 361/688, 690, 694–695, 814, 831; 451/75; 454/184

(56) References Cited

U.S. PATENT DOCUMENTS

| | | |
|---|---|---|
| 3,626,251 | 12/1971 | Vigue . |
| 4,665,714 * | 5/1987 | Keller ..................................... 62/401 |
| 5,052,284 * | 10/1991 | Schweikert .......................... 98/40.05 |
| 5,067,047 | 11/1991 | Azar . |
| 5,601,478 * | 2/1997 | Mether ................................... 651/75 |
| 5,775,122 * | 7/1998 | Waase ..................................... 62/373 |
| 6,094,929 * | 8/2000 | Eriksson .............................. 62/259.2 |

FOREIGN PATENT DOCUMENTS

| | | |
|---|---|---|
| 25 37 295 A1 | 4/1976 | (DE) . |
| 2 289 827 | 11/1995 | (GB) . |

* cited by examiner

*Primary Examiner*—Gregory Thompson
(74) *Attorney, Agent, or Firm*—Nixon & Vanderhye P.C.

(57) ABSTRACT

In cooling electrical devices (205) a Laval nozzle, is used for obtaining a cooling effect. The nozzle can be located close to the electrical device (205), which it is intended to cool, whereas the unit (209) supplying the nozzle with air, for example a fan or a compressor, can be located at another location. This is very advantageous when the electrical devices (205) to be cooled are located at locations hard to reach or access, such as in the top of antenna (201). The supplying unit (209) can then be located at the foot of the antenna where repair and service is easy to carry out.

16 Claims, 1 Drawing Sheet

METHOD AND AN APPARATUS FOR AIR-COOLING

TECHNICAL FIELD

The present invention relates to a method and an apparatus for air-cooling heat generating devices, in particular in a radio transmission system.

DESCRIPTION OF RELATED ART

In radio transmission systems, heat generating devices such as power amplifiers, are usually located at some distance from antennas used for radio signal transmission. Thus, when feeding the antennas with an amplified signal, the signal has to propagate through feeder cables. The propagation in the feeder cables is however not lossless. The losses in the feeder cables are not desired.

One solution to the problem of losses in feeder cables is to locate the power amplifiers close to the antenna, which is to be fed by the amplified signal. However, antennas in radio transmission systems are usually located at locations, which are difficult to reach. For example they can be located at the top of antenna towers and the like.

Furthermore, the power amplifiers should, in the case that they are located in an antenna tower, be small, compact and have a low weight, and therefore need to be cooled in an efficient manner. The cooling must be very efficient and capable of cooling a large amount of heat. The mere use of cooling flanges and the like will in most cases not be sufficient for providing an efficient cooling. This is due to the fact that the amplifiers used usually are very compact and emit a large amount of heat.

In order to solve this problem it is of course possible to locate fans in the vicinity of the power amplifiers. However, this is not desired since the fans are mechanical devices having moving parts, which are in need of frequent service. Thus, the fans will then be located at locations which are hard to reach and therefore difficult to service, repair or exchange. Another problem, which could occur is that the mean time before failure (MTBF) of the whole transmission system is reduced, due to the locations of such fans.

Thus, there is a problem of providing an efficient cooling for heat emitting devices in radio transmission systems, in particular when the heat emitting devices are located at locations which are hard to reach.

Further, U.S. Pat. No. 5,067,047 describes a means for cooling heat generating components mounted on the front surface of printed circuit boards. A pressurised cooling fluid is supplied via holes located where cooling is desired.

Also, U.S. Pat. No. 4,901,029 discloses a power amplifier arrangement, which includes a cooling arrangement.

However, none of the solutions outlined in these documents is suited for cooling components in radio transmission systems, mainly due to that the cooling capacity is too low and due to the cost associated with the cooling systems.

SUMMARY

It is an object of the present invention to solve the problem of providing an efficient cooling for heat emitting devices in radio transmission systems.

This object is obtained by co-locating a Laval nozzle, with the heat emitting device. In a preferred embodiment the nozzle is fed via an air feeding tube, the air pressure preferably being higher than the pressure at the outlet side of the nozzle.

In this manner the air flowing out of the nozzle can have a high velocity. For example the velocity can be the velocity of sound or higher. Thereby the thermal transmission factor is increased significantly.

The use of such an arrangement provides several advantages. Thus, since no moving parts are located at places, which are difficult to access, the MTBF for the transmission system is expected to be reduced and service will be much easier and less costly to perform.

The nozzle can be located close to the device, which it is intended to cool, whereas the unit supplying the nozzle with air, for example a fan or a compressor, can be located at another location. This is very advantageous when the electrical devices to be cooled are located at locations hard to reach or access, such as in the top of antenna towers. The supplying unit can then be located at the foot of the antenna tower where repair and service is easy to carry out.

Furthermore, since the air is compressed, the diameter of the tube used for interconnecting the nozzle with the air supplying unit can be reduced.

BRIEF DESCRIPTION OF THE DRAWINGS

The present invention will now be described in more detail by way of non-limiting examples and with reference to the accompanying drawings, in which.

DESCRIPTION OF PREFERRED EMBODIMENTS

Figure 1:
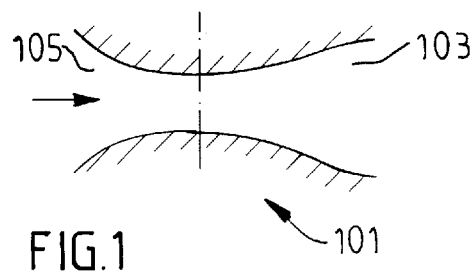
FIG. 1. is a sectional view of a Laval nozzle.

In FIG. 1. a Laval nozzle 101 is shown. A Laval nozzle is formed by a converging inlet part 105 and a diverging outlet part 103 being shaped for providing an adiabatic expansion in the nozzle. Due to the adiabatic expansion taking place in the nozzle a cooling effect is obtained whereby a reduction in temperature is produced.

The air flowing out of the nozzle can also have a high velocity, typically a velocity higher than the velocity of sound, whereby a high thermal transmission factor is obtained.

Laval nozzles are described in more detail in the book, "Mechanics of fluids", Massey, ISBN-0442 05176-X.

The amount of temperature reduction in a Laval nozzle can be obtained from the formula T denoting the temperature and P the pressure:

$$\frac{T_1}{T_2} = \left(\frac{P_2}{P_1}\right)^{\frac{1-\kappa}{\kappa}}$$

Where $$\kappa = \frac{c_p}{c_v}$$

$T_1$ being the gas temperature at the inlet of the nozzle, $T_2$ being the temperature at the outlet of the nozzle, $P_1$ being the pressure at the inlet of the nozzle and $P_2$ being the pressure at the outlet of the nozzle. $C_p$ is the specific heat capacity for a thermodynamic change at constant pressure and $C_v$ is the specific heat capacity for a thermodynamic change at constant volume.

Thus, in order to obtain a temperature reduction from 298 K to 273 K, the pressure $P_1$ need to be 1.35 atm for air, $C_p/C_v$ being approximately 1.4 for air.

Figure 2:
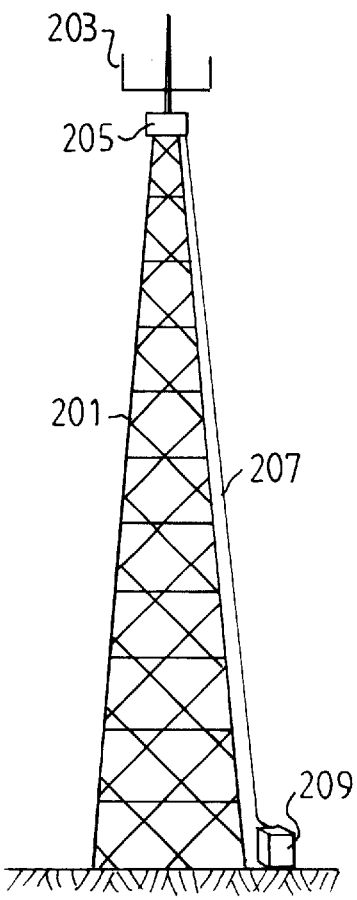
FIG. 2. is a general view of an antenna tower in a radio transmission system.

In FIG. 2 an antenna tower 201 is shown. The antenna tower 201 carries an antenna 203. The antennas are fed with signals which have been amplified by power amplifiers 205, which are located close to the antennas at the top of the antenna tower 201.

In order to cool the power amplifiers 205, and/or other heat emitting devices located at the same location, Laval nozzles, as described above, are also located at the same location, i.e. adjacent to the power amplifiers 205.

The Laval nozzles are in a preferred embodiment supplied with air through a tube 207, which in its other end is connected to an air supplying unit 209, such as a fan or a compressor. The air supplying unit is located at the foot of the antenna tower 201, where it is easy to access for carrying out different kinds of service. It may also be possible to direct the outflow from the nozzle directly towards the component/device, which is to be cooled.

The advantage of supplying the Laval nozzle with air in this manner is that the fan can be located at a location which easily can be reached for carrying out services of different kinds.

Figure 3:
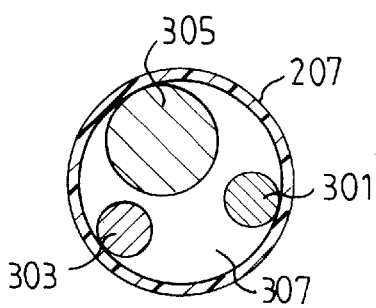
FIG. 3. is a sectional view of a cable which can be used for feeding a Laval nozzle.

FIG. 3 shows a section of the tube 207 in a preferred embodiment. In this embodiment the tube 207 is a combined tube, which in an integrated manner can provide air, electrical power and a transmission signal to the top of the antenna tower. In another preferred embodiment the integrated tube also has means for returning the air supplied to the top of the antenna tower. Thus, the tube 207 integrated comprises a transmission line 301, an electric power supply line 303, and an air supply line 305. The diameter of the combined tube is approximately 50–60 mm.

This is advantageous, since only one cable has to interconnect the foot of the antenna tower with its top. Electrical power and a signal transmission line will always have to be supplied to the top of the antenna tower, and by combining them into one single cable, together with the air supply line, the connection is facilitated.

In a preferred embodiment, the tube 207 also comprises a return channel for air 307. This is advantageous, since the power amplifiers and the nozzle then can be placed in an air-tight housing. Such an arrangement will prevent dust from entering the cooling system. Also, oxidation will be prevented if such an air-tight housing is used.

Figure 4:
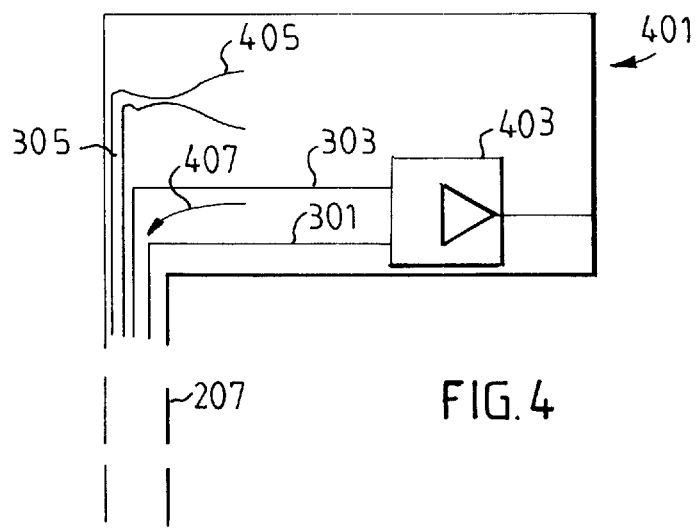
FIG. 4 is a sectional view of an air-tight housing, which houses a nozzle and a heat emitting power amplifier.

In FIG. 4, a section through an air-tight housing 401 is shown. The housing 401 houses an amplifier 403, which is connected to the transmission line 301 and the electric power supply line 303. The amplifier 403 is cooled by air flowing out of the outlet of a nozzle 405. The nozzle is fed with air having a pressure higher than 1 atm. via the tube 305. The air which enters the air-tight hosing 401 exits the housing 401 via the return channel 307 as indicated by the arrow 407.

In another preferred embodiment, the nozzle 405 is thermally isolated. This is an advantage when the nozzle provides an adiabatic expansion resulting in a reduction in temperature. If the nozzle is not thermally isolated some of the cooling effect resulting from the temperature reduction can be lost.

The method and the apparatus for cooling electronic devices as described herein is particularly well suited for cooling at locations which are hard to reach. Thus, the parts of the cooling system, which are most likely to need repair and service can be located at locations which are easy to access and the devices that need to be cooled can be located where they best fulfil their purpose, which may be at a location that is not suited for easy access.

What is claimed is:

1. An apparatus for air-cooling an electric device in combination with the electric device, the combination comprising:

a nozzle connected to an air supply unit feeding the nozzle with air via a tube, the nozzle being located in the vicinity of the electric device, wherein the nozzle is a Laval nozzle; and wherein the electric device is located at the top of an antenna tower, and the air supply unit is located at the foot of the antenna tower.

2. An apparatus according to claim 1, characterised in that the nozzle is connected to the air supply unit via a tube also housing a power line and/or a transmission line.

3. An apparatus according to claim 1, characterised in that the tube also has means for returning the air fed to the nozzle.

4. An apparatus according to claim 1, characterised in that the nozzle is located at a radio transmission site.

5. An apparatus according to claim 1, characterised by means for letting the air out from the nozzle at a velocity higher than the velocity of sound.

6. An apparatus according to claim 1, characterised in that the nozzle is located in an air-tight housing.

7. A method of cooling an electrical device, comprising:

air being blown out of a nozzle and directed at or in the vicinity of the electric device, the nozzle being connected to an air supply unit feeding the nozzle with air via a tube, and wherein the air is blown out of a Laval nozzle; and wherein the electric device is located at a top portion of an antenna tower, and the air supply unit is located at a foot of the antenna tower.

8. A method according to claim 7, characterised in that the nozzle is connected to the air supply unit via a tube also housing a power line and/or a transmission line.

9. A method according to claim 7, characterised in that air fed to the nozzle is returned through the feeding tube.

10. A method according to claim 7, characterised in that the nozzle is located at a radio transmission site.

11. A method according to claim 7, characterised in that the air is let out of the nozzle at a velocity higher than the velocity of sound.

12. A method according to claim 7, characterised in that the nozzle is located in an air-tight housing.

13. An apparatus for air-cooling an electric device, comprising:

a nozzle connected to an air supply unit feeding the nozzle with air via a tube, the nozzle being located in the vicinity of the electric device, wherein the nozzle is connected to the air supply unit via the tube also housing a power line and/or a transmission line.

14. A method of cooling an electric device comprising:

wherein air is blown out of a nozzle and directed at or in the vicinity of the electric device, the nozzle being connected to an air supply unit feeding the nozzle with air via a tube; and wherein the nozzle is connected to the air supply unit via a tube also housing a power line and/or a transmission line.

15. An apparatus for air-cooling a device, the apparatus for air cooling comprising:

a nozzle connected to an air supply unit feeding the nozzle with air via a tube;

wherein the nozzle comprises a Laval nozzle; and wherein the nozzle is connected to the air supply unit via a tube also housing a power line and/or a transmission line.

16. An apparatus for air-cooling, the apparatus for air cooling comprising:

a nozzle connected to an air supply unit feeding the nozzle with air via a tube;

wherein the nozzle comprises a Laval nozzle; and wherein the tube includes means for returning the air fed to the nozzle.

* * * * *